United States Patent
Forehand

(10) Patent No.: US 8,309,387 B2
(45) Date of Patent: Nov. 13, 2012

(54) IMPROVING BACK-CONTACT PERFORMANCE OF GROUP VI CONTAINING SOLAR CELLS BY UTILIZING A NANOSCALE INTERFACIAL LAYER

(76) Inventor: David Forehand, Plano, TX (US)

(*) Notice: Subject to any disclaimer, the term of this patent is extended or adjusted under 35 U.S.C. 154(b) by 389 days.

(21) Appl. No.: 12/102,843

(22) Filed: Apr. 14, 2008

(65) Prior Publication Data

US 2008/0251119 A1  Oct. 16, 2008

Related U.S. Application Data

(60) Provisional application No. 60/911,543, filed on Apr. 13, 2007.

(51) Int. Cl.
*H01L 21/00* (2006.01)
*H01L 31/00* (2006.01)

(52) U.S. Cl. .............. 438/57; 438/98; 136/256

(58) Field of Classification Search .......... 136/255, 136/256; 438/57, 98; 427/74
See application file for complete search history.

(56) References Cited

U.S. PATENT DOCUMENTS

| | | | | |
|---|---|---|---|---|
| 4,410,758 A * | 10/1983 | Grolitzer | | 136/254 |
| 5,248,348 A | 9/1993 | Miyachi et al. | | |
| 5,501,744 A | 3/1996 | Albright et al. | | |
| 5,632,820 A * | 5/1997 | Taniyama et al. | | 118/724 |
| 5,746,197 A | 5/1998 | Williams | | |
| 6,077,775 A * | 6/2000 | Stumborg et al. | | 438/643 |
| 6,281,035 B1 | 8/2001 | Gessert | | |
| 6,458,254 B2 | 10/2002 | Gessert | | |
| 6,913,943 B2 * | 7/2005 | Cunningham et al. | | 438/57 |
| 7,414,294 B2 | 8/2008 | Forrest | | |
| 7,534,710 B2 | 5/2009 | Katayama et al. | | |
| 2003/0230338 A1 | 12/2003 | Menezes | | |
| 2010/0207549 A1 | 8/2010 | Meldrum et al. | | |

OTHER PUBLICATIONS

Sugiyama, Koichi, et al., "Study of Fluorination of CdTe Surfaces", 1990, Thin Solid Films, 198, pp. 347-355.*
PCT/US08/60280; International Search Report and Written Opinion of ISA/US; Aug. 1, 2008.
McCandless et al.; "Optimization of Vapor Post-Deposition Processing of Evaporated CdS/CdTe Solar Cells"; Institute of Energy Conversion, University of Delaware, Newark DE; Progress in Photovoltaics: Research and Applications 1999; 7: 21.
Chen, Lei; "Random Deposition Model of CdS Layer in CdS/CdTe Thin-Film Solar Cells"; Colorado State Univ., Fort Collins, CO; 2008.
Hasoon et al.; "The Morphology of CdS Thin Films Deposited on SnO2-Coated Glass Substrates"; National Renewable Energy Laboratory, US DoE/Midwest Research Institute; 1997.
National Technology Initiative; "Nanotechnology—Big Things from a Tiny World"; National Nanotechnology Coordination Office, Arlington, VA; 2007. http://www.nano.gov/Nanotechnology_BigThingsfromaTinyWorldspread.pdf.
Liao, Wei; "Lecture 17. Properties of nanomaterials—Fundamentals"; Michigan State University; 2008. http://www.egr.msu.edu/liao/BE825/lecture17.pdf.

* cited by examiner

*Primary Examiner* — Basia Ridley
*Assistant Examiner* — Tamir Ayad
(74) *Attorney, Agent, or Firm* — Carr LLP

(57) ABSTRACT

A method of making thermodynamically stable, diffusion-impeded barrier layers within, for example, a photovoltaic cell with a metal-containing electrical contact using exposure to fluorine. Exposing the cadmium telluride surface to fluorine creates a Te-poor barrier layer of cadmium fluoride. Once that barrier layer is formed, the metal-containing electrical contact may be applied or formed. The barrier layer allows tunneling current to occur between the p-type layer and the metal-containing electrical contact establishing a low-resistance, highly uniform, and thermally stable electrical contact.

36 Claims, 1 Drawing Sheet

IMPROVING BACK-CONTACT PERFORMANCE OF GROUP VI CONTAINING SOLAR CELLS BY UTILIZING A NANOSCALE INTERFACIAL LAYER

CROSS REFERENCE TO RELATED APPLICATIONS

This application claims the benefit of U.S. provisional patent application No. 60/911,543, filed Apr. 13, 2007, which is incorporated herein by reference.

BACKGROUND OF THE INVENTION

1. Technical Field

The present invention relates generally to photovoltaic devices containing a Group VI element. More particularly, this invention relates to the creation of thermodynamically stable, non-moving compounds within a photovoltaic device, for example having a cadmium telluride p-type layer with a metal-containing (e.g., copper-containing) electrical contact, upon exposure to fluorine atoms (e.g., via plasma treatment).

2. Description of Related Art

The need for affordable, renewable sources of energy has become more of a focus of public interest and scientific research in light of the rising price of traditional energy sources. Photovoltaic cells have the ability to convert sunlight, a practically infinite energy source, into direct electrical current. Single crystal photovoltaic cells exhibit high operation performance, up to 25-30% conversion efficiency, but are relatively costly to manufacture, and require a significant amount of raw materials. Polycrystalline and amorphous materials can also be used however they are relatively less efficient and less expensive.

A Group II-VI thin film photovoltaic cell comprised of, for example, polycrystalline cadmium telluride (CdTe) and cadmium sulfide (CdS), elements from Group II and VI of the Periodic Table of Elements, has shown great promise as research has successfully introduced the use of polymers, dye-sensitized materials, and thin films of either amorphous or polycrystalline materials. CdTe has a very high absorption coefficient of incident light due to its band gap matching well to that of sunlight and the CdS/CdTe photovoltaic cell has demonstrated conversion efficiencies of up to 16.5% in the laboratory.

There are many details and different methods of fabricating a CdTe solar cell; a description of one process follows. The physical structure of a typical CdS/CdTe photovoltaic cell typically starts with a glass superstrate and a transparent conducting oxide (TCO) layer, such as tin oxide, indium tin oxide, or cadmium stannate, placed on the superstrate. Then, for example, a CdS layer, doped to create a n-type material (i.e., the majority charge carriers within the layer are electrons), is deposited on to the TCO surface. The n-CdS layer has a wide band gap, wide enough to allow most incident solar radiation through thus serving as a transparent, or window, layer. The n-CdS layer is typically a thin layer—about 0.1 micrometer ($\mu$m) and it allows more of the incident sunlight to pass through the layer.

Another layer, a p-type CdTe layer (i.e., the majority charge carriers within this layer are holes), is deposited atop the CdS layer. The current industry standard for creating a good quality p-type CdTe layer is to anneal, usually at about 400° C., the CdTe layer in the presence of $CdCl_2$. The p-CdTe layer, typically much thicker than the CdS layer at about 2 to 10 $\mu$m thick, absorbs the majority of incident light due to its previously-described high absorption coefficient. The bulk of electrons and holes freed by the absorption of photons are created within this layer.

A charge imbalance across the boundary between the n-CdS layer and the p-CdTe layer, or the p-n junction, creates an electric field. This electric field, spanning the p-n junction, separates the freed electrons and holes. Holes may travel from the p-type side across the junction to the n-type side and, electrons may pass from the n-type side to the p-type side. However, the p-n junction allows conventional current to flow in only one direction thus behaving as a diode.

Electrical contacts on the photovoltaic cell allow current to be collected and flow to external circuits. In the CdS/CdTe photovoltaic cell, the transparent conducting oxide layer serves as the front contact. A metallic layer placed onto the p-CdTe layer, functions as the back, or rear contact. However, a stable, low-resistance ohmic contact with p-CdTe is very difficult to obtain due to CdTe's band gap and high electron affinity. Together, for an ohmic contact to p-CdTe, these characteristics would require the back contact material to have a very high work function—greater than 5.78 eV—in order to facilitate hole transport from CdTe. Unfortunately, no metal satisfies this requirement. In addition to the difficulty p-CdTe itself poses to the formation of an ohmic back contact, the metal contact-CdTe interface itself can also create a Schottky barrier of sufficient height and width to significantly limit hole transport from CdTe. Essentially, this barrier behaves as a diode with characteristics directly opposite to that of the p-n junction. Thus, the Schottky barrier diode blocks the desired flow of photo-generated charge carriers, greatly increasing the resistance of the back contact and limiting the total cell current generated, which ultimately reduces the efficiency of the solar cell.

Currently, the art addresses creating a Te-rich surface in order to obtain a low-resistance electrical contact to p-type CdTe and the most successful contacts on p-CdTe first create, by various methods, a Te-rich thin layer at the p-CdTe surface, then the method calls for applying a metal, which often is copper. Copper is believed to be effective because it increases the effective doping level by creating a $p^+$-layer near the p-CdTe surface at the electrical contact through interdiffusion with CdTe assisting in the establishment of quantum mechanical tunneling that simulates an ohmic contact. This interdiffusion can also precipitate the formation of a physically distinct layer of cuprous telluride ($Cu_2Te$). The $Cu_2Te$ layer is thought to be important in achieving an ohmic contact to p-CdTe.

Copper has another more dubious distinction; its diffusion is known to be one of the main causes of instability and degradation of the performance CdTe photovoltaic cells. Copper is a fast diffuser that moves within the crystal and along the grain boundaries of the characteristically polycrystalline thin-film CdTe. It tends to diffuse away from the contact, interact with other constituents of the cell and accumulate at the p-n junction and in the CdS layer. This Cu diffusion causes the back contact to degrade, making the contact more resistive, less able to transport charge carriers, and its accumulation decreases cell performance and stability. Although copper can react with tellurium to form $Cu_2Te$, thought to be a beneficial compound, it is believed that this compound is less thermodynamically favorable than CdTe. Further, the conversion of $Cu_2Te$ to cupric telluride (CuTe), which is a less thermodynamically stable, is also believed to contribute to cell degradation. Tellurium, being more desirous to bind with the cadmium, leaves some quantity of $Cu_2Te$ and CuTe thereby allowing copper to diffuse.

Research continues to address the problem of copper diffusion away from, and subsequent degradation of, the back contact. Some research has contemplated eliminating the copper back contact all together through heavily doping the CdTe surface near the back contact with p-dopants such as mercury, silver, and antimony, or the use of copper-free contacts such as antimony telluride ($Sb_2Te_3$). Other research has investigated forming an interfacial layer (IFL), using aniline, between the p-CdTe and a contact metal of Cu or Au. However, there currently is no definitive solution that provides an efficient method to create a stable low-resistance back contact in CdTe photovoltaic cells.

SUMMARY OF INVENTION

The present invention is a method of making a diffusion-impeding barrier layer, also known as interfacial layer (IFL), within a photovoltaic cell comprising, for example, cadmium telluride, cadmium sulfide, and a metal-comprising electrical contact, by exposing the surface of the cadmium telluride layer to a halogen (e.g., fluorine) to create a Te-poor cadmium fluoride barrier layer. The present invention is not limited to copper and will work for any metal electrical contact metal, as well as any material comprising any a Group II-VI element, including but not limited to CuInGaSe photovoltaic material, also known as CIGS. Although specific reference is made to CdTe photovoltaics, the invention is not limited thereto. A skilled artisan will appreciate that virtually any photovoltaic material can benefit from the teachings herein. By inhibiting metal diffusion and maintaining the integrity of the electrical contact, these compounds increase the efficiency and serviceable lifetime of a photovoltaic.

For example, the present invention provides a more thermally stable, low-resistance contact on a p-type CdTe photovoltaic cell by forming a Te-poor barrier layer of $CdF_2$, which is a more thermodynamically stable compound than CdTe, $Cu_2Te$, or CuTe, by exposing the p-type layer to a fluorine-containing plasma. The $CdF_2$ compound inhibits the diffusion of copper, or other contact metal. By inhibiting Cu-diffusion, the efficiency of the CdTe photovoltaic cell and the serviceable lifetime are increased.

Surprisingly, and contrary to standard industry practice of creating Te-rich surfaces on CdTe layers, it has been found that creating a Te-poor surface provides a diffusion-inhibiting barrier layer that impedes the diffusion of metal from, for example, a metal contact. The formation of a, for example, cadmium fluoride layer provides several unique features including but not limited to: providing a barrier between CdTe, or other Group II-VI containing compounds and the contact to significantly reduce the diffusion of Cu or other contact metals; creating a Te-poor surface; creating a more uniform type II-VI surfaces (e.g., p-CdTe surface), by reducing the effects of weak-diodes and increasing PV performance uniformity across the PV module and module-to-module; cleaning the CdTe surface or other II-VI compound surfaces; ability to passivate CdTe, or other II-VI compounds and grain boundaries; and ability to adjust or tailor the thickness depending on the II-VI compound and metal contact material. The technique is a dry process and requires a relatively short amount of processing time, thereby allowing easy process flow integration. In addition, a thinner absorber layer may be used. For example, a p-CdTe layer of less than about 2 microns thick may be used instead of the current industry standard 4-10 microns. This would have the added advantages of lower material utilization, faster throughput, and greater charge collection due to the lower recombination.

For a copper-containing contact metal on p-CdTe, the cadmium fluoride barrier layer should be of a thickness that impedes the diffusion of copper through the cell while allowing tunneling current from the p-type cadmium telluride layer to the back contact. In one embodiment, the thickness is less than about 25 nm or less than about 10 nm. The $CdF_2$ barrier layer facilitates the establishment of a thermally-stable low-resistance contact between the p-type cadmium telluride layer and the back contact, which increases the efficiency and lifetime of the photovoltaic cell.

The present invention is directed to providing at least one diffusion-impeding barrier layer between a p-type layer of a photovoltaic cell and an electrical contact. The method includes the steps of providing a p-type layer, creating a diffusion impedance barrier layer atop the p-type layer by exposing at least one surface of the p-type layer to a halogen (e.g. fluorine), and forming an electrical contact having a metal atop the diffusion impedance barrier layer. The invention also is directed to articles of manufacture having such a barrier layer. The article of manufacture includes a p-type layer, a diffusion impedance barrier layer having a halogen atop the p-type layer, and an electrical contact having a metal atop the diffusion impedance barrier layer. It will be understood that specific embodiments described below are applicable to both the methods and articles of manufacture (e.g., photovoltaic devices) of the present invention. It also should be understood that the layers described herein may be separated by other layers not described herein and "atop" does not necessarily mean directly atop or over.

In some embodiments, the forming step may create a copper fluoride barrier layer between the diffusion impedance barrier layer and the electrical contact. In some embodiments, the diffusion impedance barrier layer impedes the diffusion of a metal from the electrical contact into the p-type layer. In other embodiments, the impedance barrier layer may have a thickness of about 0.5 to about 25 nanometers. In some embodiments, the impedance barrier layer allows the tunneling of current from the p-type layer of the photovoltaic cell to the electrical contact. Some embodiments may include the step of creating a second diffusion impedance barrier layer atop the p-type layer by exposing at least one surface of the first diffusion impedance barrier layer to a halogen (e.g., fluorine).

In some embodiments, the p-type layer may include a p-doped cadmium telluride. In some embodiments, the metal may be copper, gold, silver, aluminum, zinc, tin, lead, gallium, selenium, antimony, nickel, cobalt, cesium, magnesium, mercury, ZnTe, HgTe, $Sb_2Te_3$, tin oxide, indium tin oxide, and cadmium stannate, as well as combinations thereof. The fluorine exposing step may be carried out by plasma treatment, hot plate, temperature-controlled chuck, rapid thermal annealing, photon treatment, ion implantation, hydrogen fluoride bath, or combinations thereof. In some embodiments, the exposing step may be performed at temperatures of about 500° C. or less or about 400° C. or less. In some embodiments, the exposing step may be carried out by plasma treatment in the presence of a fluorine gas.

In some embodiments, the p-type layer may include sulfur, selenium, tellurium, and polonium. Examples of compounds present in the p-type layer include CdTe, HgTe, ZnTe, ZnS, and/or CuInGaSe. Examples of other elements that may be present in the p-type layer include Hg, Cd, Zn, Sb, Cu, In, and/or Ga. In some embodiments, the diffusion impedance barrier layer may include cadmium fluoride. In other embodiments, the second diffusion impedance barrier layer may include cupric fluoride.

In some embodiments, the method may include the additional steps of providing a n-type layer, creating a third barrier layer atop the n-type layer by exposing at least one surface of the n-type layer to a halogen, and depositing the p-type layer atop the third barrier layer. In some embodiments, the third barrier layer may include cadmium fluoride. In other embodiments, the n-type layer may include n-doped cadmium sulfide. In some embodiments, the p-type layer may include p-doped cadmium telluride.

As discussed, the articles of manufacture may include a p-type layer, a diffusion impedance barrier layer having a halogen atop the p-type layer, and an electrical contact having a metal the diffusion impedance barrier layer. In some embodiments, the article includes a copper fluoride barrier layer between the diffusion impedance barrier layer and the electrical contact. In some embodiments, the diffusion impedance barrier layer may include cadmium fluoride. In other embodiments, the second diffusion impedance barrier layer comprises cupric fluoride. The articles may also include a n-type layer and a third barrier layer having a halogen between the n-type layer and the p-type layer. The third barrier layer may include cadmium fluoride. The n-type layer may include n-doped cadmium sulfide. The p-type layer may include p-doped cadmium telluride.

The present invention also includes a method of making a diffusion-impeding barrier layer between a p-type layer of a photovoltaic cell and an electrical contact. The method includes the steps of providing a p-type cadmium telluride layer, creating a diffusion impedance barrier layer on the p-type layer by exposing at least one surface of the p-type layer to a plasma comprising fluorine to create a cadmium fluoride barrier layer atop the p-type layer, and forming a electrical contact having copper atop the cadmium fluoride barrier layer, wherein the forming step creates a copper fluoride barrier layer between the diffusion impedance barrier layer and the metal-comprising electrical contact. The method may include the additional steps of providing a n-type layer, creating a third barrier layer atop the n-type layer by exposing at least one surface of the n-type layer to a halogen, and depositing the p-type layer atop the third barrier layer. In some embodiments, the third barrier layer may include cadmium fluoride and/or the n-type layer may include n-doped cadmium sulfide.

Other features and advantages of the present invention will become apparent upon reading the following detailed description of embodiments of the invention and the appended claims.

BRIEF DESCRIPTION OF DRAWINGS

The invention and a preferred mode of use may be illustrated by the appended figures.

DETAILED DESCRIPTION

Figure 1:
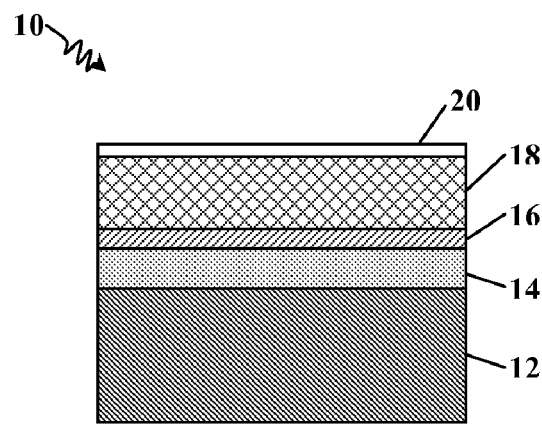
FIG. 1 is a cross-sectional view of a typical thin film photovoltaic cell comprising cadmium telluride (CdTe) and cadmium sulfide (CdS) in accordance with one embodiment of the present invention.
Figure 2:
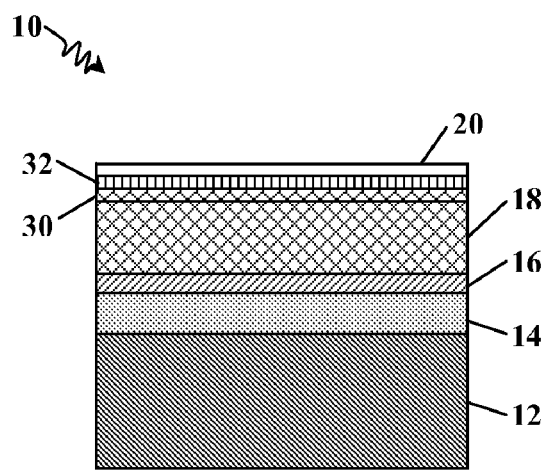
FIG. 2 is cross-sectional view of a preferred embodiment of the photovoltaic cell shown in FIG. 1 after exposure to a fluorine containing plasma in accordance with one embodiment of the present invention.

In the following detailed description, reference may be made to the drawings, which show by way of illustration specific embodiments in which the invention may be practiced. These embodiments are described in sufficient detail to enable those skilled in the art to practice the invention, and it will be understood by the skilled artisan that other embodiments may be utilized. It is also to be understood that structural, procedural and system changes may be made without departing from the spirit and scope of the present invention. The following detailed description, therefore, is not to be taken in a limiting sense, and the scope of the present invention is defined by the appended claims and their equivalents. For clarity of exposition, like features shown in the accompanying drawings are indicated with like reference numerals and similar features as shown in alternate embodiments in the drawings are indicated with similar reference numerals. FIGS. 1 and 2 are enlarged cross-sectional views of a thin film photovoltaic cell comprising cadmium telluride (CdTe) and cadmium sulfide (CdS) without and with the plasma treatment according to the invention, respectively.

Referring first to FIG. 1, a typical CdS/CdTe thin film photovoltaic cell 10 is shown. The cell 10 begins its construction with a superstrate 12, such as a glass, metal, or polyimide. Deposited upon the superstrate 12 is a transparent conducting oxide (TCO) 14, typically a tin oxide, indium tin oxide, or cadmium stannate. TCO 14 serves as the front electrical contact for the cell 10. A thin window layer 16 of n-doped cadmium sulfide (n-CdS) layer 16 is deposited onto the TCO 14. The p-doped cadmium telluride (p-CdTe) layer 18 is deposited onto the n-CdS layer 16 and the p-CdTe usually receives a $CdCl_2$ treatment, at about 400 C, to activate the p-type CdTe. A copper or copper-containing back electrical contact 20 is either deposited or applied onto the p-CdTe layer 18.

FIG. 2 shows the cell 10 in FIG. 1 after the fluorine plasma process of one embodiment of the present invention. A Te-poor, thermodynamically stable, non-moving cadmium fluoride ($CdF_2$) barrier layer 30 is formed on the surface of the p-CdTe layer 18 prior to the application of the copper-containing back contact 20. During and/or after application of the back contact 20, a thermodynamically stable, non-moving cupric fluoride ($CuF_2$) layer 32 is formed between the $CdF_2$ barrier layer 30 and the back contact 20.

Before (treatment) according to the present invention, the photovoltaic cell 10 is constructed in its usual manner up to and including the p-type CdTe layer 18. Then, a plasma containing fluorine is flowed over the p-CdTe layer 18 to create a thermodynamically stable $CdF_2$ barrier layer 30 that completely covers its surface. The plasma is created, and the cell 10 is exposed to the plasma, in a plasma reactor akin to those used in typical semiconductor fabrications. This fluorine-containing plasma can be created using a compound that can release atomic fluorine, such as $SF_6$, $XeF_2$, $NF_3$, $CF_4$, $Cl_3F$, $SiF_4$, $CCl_2F_2$, $CHF_3$, and $C_2F_6$.

During the formation of the $CdF_2$ barrier layer 30, tellurium is preferentially removed from the surface of the p-type CdTe layer 18 through the formation of volatile, at room temperature, tellurium fluorides. A $TeF_6$, or $TeF_4$ or $TeF_x$, volatile compound(s) is created that desorbs from surface leaving the newly formed non-volatile $CdF_2$ barrier layer 30. The resulting $CdF_2$ barrier layer 30 is relatively thin, preferably about 0.5 to about 10 nanometers thick. This thickness is sufficient to impede the diffusion of copper atoms through the cell 10 while allowing tunneling current between the p-CdTe layer 18 and back contact 20 to occur. The following equation depicts the probable chemical reaction that may be used to create a $CdF_2$ barrier layer 30:

$$CdTe(s) + 8/3 NF_3(g) \rightarrow CdF_2(s) + TeF_6(g)\uparrow + 4/3 N_2(g)\uparrow,$$
$$\Delta G_f = -1548.8 \text{ kJ/mol } CdF_2$$

In the reaction shown above, the right side of the reaction is favored. Essentially, the CdF$_2$ barrier layer 30 formation process is a plasma "etch" of the p-CdTe layer 18. The "etch" is the preferential removal of tellurium from the surface of the p-CdTe layer 18 due to its reaction with fluorine forming a volatile compound that readily desorbs from the surface leaving behind the barrier layer 30. Control of the CdTe temperature, preferably less than about 500° C., and ion bombardment within the plasma reactor (e.g., controlling plasma parameters like reactant gas flow rate, power, pressure, bias, and fluorine-containing species used) governs the thickness of the CdF$_2$ barrier layer 30 and may also be used to tailor its properties. As the number of ions or the ion energy increases, the "etch-rate" increases but the thickness of the CdF$_2$ barrier layer 30 will decrease due to energetic ions knocking off (sputtering) CdF$_2$ molecules previously formed. Without ion bombardment, the CdF$_2$ barrier layer 30 molecules may not be removed and the layer 30 will grow thicker until the "etch-rate" slows to about zero. Consequently, the growth of the CdF$_2$ barrier layer 30 may become a self-limiting process. The ultimate thickness of the CdF$_2$ layer 30 may also depend upon the back contact 20 material.

Rather than using a plasma, other methods using a fluorine-comprising gas can be used to from the CdF$_2$ barrier layer 30 such as thermal methods (e.g., a hotplate, temperature controlled chuck, or Rapid Thermal Anneal) preferably at a temperatures of about 500° C. or less, photon-assisted methods, ion implantation of the fluorine, and placing CdTe into a bath containing hydrogen fluoride (HF). The use of a plasma may remove CdTe surface oxides and other surface contaminants, may control CdF$_2$ thickness, and is an "all dry" process (e.g., allows for in-situ contact material deposition without breaking vacuum).

After the CdF$_2$ barrier layer 30 is created on the surface of the p-CdTe layer 18, a copper-containing contact 20 is deposited or applied onto of the surface of the CdF$_2$ barrier layer 30 using methods known to those skilled in the art, such as the deposition of a metallic copper layer or application of a copper-containing dag paste. Copper in the contact 20 reacts with fluorine in the CdF$_2$ barrier layer 30 creating another thermodynamically stable, non-moving barrier layer 32 of material, CuF$_2$. The equation below depicts one chemical reaction that is thought to create a CuF$_2$ barrier layer 32:

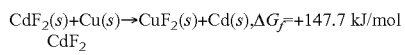

$$CdF_2(s) + Cu(s) \rightarrow CuF_2(s) + Cd(s), \Delta G_f = +147.7 \text{ kJ/mol CdF}_2$$

In the reaction shown above, the left side of the reaction is favored. However, the CdF$_2$ barrier layer 30 forms an effective barrier to copper diffusion. And, because fluorine and copper form the thermodynamically favorable compound CuF$_2$ ($\Delta G_f = -500$ kJ/mol), compared to Cu only ($\Delta G_f = 0$ kJ/mol), the diffusion of free copper atoms through both the CuF$_2$ barrier layer 32 and CdF$_2$ barrier layer 30 to the p-CdTe layer 18 is unlikely.

Along with the formation of barrier layers 30 and 32, the fluorine plasma, due to its fluid, mobile state, can easily flow into the polycrystalline crevices of the characteristically porous p-CdTe layer 18 to form CdF$_2$ within these grain boundaries and interact with migrating copper atoms already within them to create CuF$_2$ as well.

Figure 3:
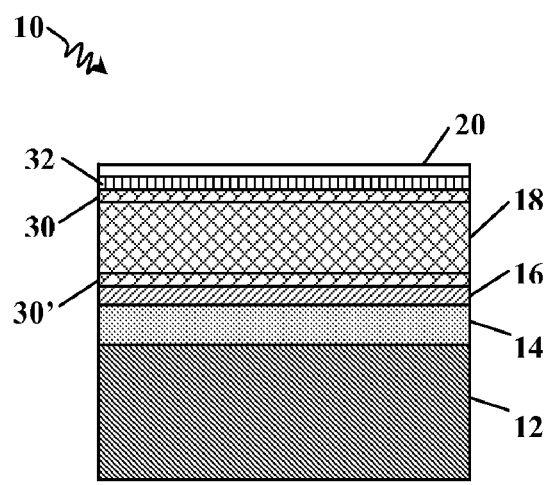
FIG. 3 is a cross-sectional view of another embodiment of the photovoltaic cell shown in FIG. 1 after exposure to a fluorine containing plasma in accordance with one embodiment of the present invention.

Another embodiment of the present invention is illustrated in FIG. 3. In this embodiment, a thermodynamically stable, non-moving CdF$_2$ barrier layer 30' is formed between the n-CdS layer 16 and the p-CdTe layer 18 in addition to barrier layers described above. Exposing the n-CdS layer 16's surface to the fluorine-containing plasma creates the CdF$_2$ barrier layer 30' prior to the deposition of the p-type CdTe layer 18. As well as impeding or inhibiting metal (e.g., copper) diffusion, the creation of the CdF$_2$ layer 30' slows the degradation of the n-CdS layer 16 caused by, for example, migrating copper atoms reacting with the sulfur constituent of layer 16 to create cuprous sulfide (Cu$_2$S). Absent an obstacle to that reaction's progress like the one posed by barrier layer 30', it may eventually degrade the typically thin n-CdS layer 16.

Since Cu acts as a p-type dopant within CdTe, some Cu diffusion into p-CdTe may have desirable effects by increasing the p-type concentration of the p-CdTe. However, current methods using a Cu-containing contact to p-CdTe have ineffectual control of both the amount of copper at the back contact and copper doping within the p-CdTe. Therefore, another embodiment of the present invention is to intentionally doping p-CdTe with Cu by depositing a controlled amount of Cu, preferably less than 10 nm, onto the p-CdTe prior to the formation of the Te-poor interfacial layer, CdF$_2$, and perform a controlled anneal, typically at less than about 250° C., to attain the desired amount of Cu within the p-CdTe. Then a Te-poor interfacial layer, CdF$_2$, is formed in the previously-described manner. After the CdF$_2$ interfacial layer is created on the surface of the p-CdTe layer, a copper-containing contact is deposited or applied onto the surface of the CdF$_2$ barrier layer. An advantage of this embodiment is that the amount of copper doping of p-CdTe separately can be controlled from the formation of the copper-containing contact to p-CdTe. However, some Cu may diffuse into the n-CdS, which is undesirable.

A method to further improve the above desirable Cu doping of p-CdTe may be to limit the undesirable Cu diffusion into the n-CdS by forming a thermodynamically stable, non-moving CdF$_2$ barrier layer between the n-CdS and p-CdTe, as described above.

This present invention's method of treating CdS/CdTe (and other) photovoltaic cells with a fluorine-containing plasma provides an efficient solution to a major drawback of photovoltaic cells—the diffusion of a metal (e.g., copper) from an electrical contact into the cell. The copper diffusion problem has been a significant impediment to the commercialization of CdS/CdTe photovoltaic cells. This invention reduces copper diffusion through the cell 10 through the interaction of atoms and/or ions in the plasma with the constituents of the cell 10 to form thermodynamically stable barrier layers 30, 30' and 32 that physically impede the ability of copper (and other metals) to diffuse through the cell 10.

The CdF$_2$ barrier layer 30 also serves as a tunneling interfacial contact layer, facilitating hole transport from the p-CdTe barrier layer 18 to the electrical contact; thus, decreasing the contact resistance of the metallic contact 20 and assisting in the establishment of a quasi-ohmic contact between the p-type CdTe layer 18 and the electrical contact 20. The currently accepted approach of promoting the formation of a Te-rich CdTe surface and subsequently the formation of a Cu$_2$Te layer between p-CdTe layer 18 and electrical contact 20 in order to establish the quasi-ohmic contact is a much less thermodynamically favorable solution than the barrier layers 30 and 32 formed by this invention. Unlike the copper in Cu$_2$Te, copper binds tightly to the fluorine in CuF$_2$ and therefore does not easily dissociate and diffuse through the cell 10. All these solutions work in tandem to increase the efficiency and lifetime of the photovoltaic cell 10.

Although the embodiments as described involve the exposure of a CdS/CdTe photovoltaic cell to a fluorine-comprising plasma (or other fluorine exposure method), the method of this invention is applicable to other Group VI (e.g., S, Se, Te) containing photo-electric devices. Fluorine is relatively thermodynamically stable, is solid at room temperature, compounds with non-Group VI elements, and forms volatile compounds with Group VI elements. Thus, fluorine-comprising plasma may be used to treat other Group VI-containing devices. Since elements within each group share similar thermodynamic characteristics, results similar to those described above may be expected for other materials. Alternative embodiments and various modifications within the spirit and scope of the invention will be apparent to those of skill in the art.

What is claimed is:

1. A method of making nanoscale layers within photovoltaic cell material containing a Group VI element, comprising:
    exposing at least a surface of a portion of a photovoltaic cell material containing a Group VI element to a gas containing the element fluorine, wherein the gas substantially concomitantly:
        removes at least a portion of the Group VI element from atop the photovoltaic cell material; and
        forms a nanoscale layer of material, wherein at least a portion of the nanoscale layer of material has a thickness of about 0.5 to 25 nanometers and comprises fluorine and at least one element other than a Group VI element atop at least a portion of the exposed photovoltaic cell material containing a Group VI element; wherein the at least a portion of the nanoscale layer starts at an interface with the surface of the photovoltaic cell material containing a Group VI element and ends at an interface with an adjacent layer of an operable photovoltaic cell.

2. The method of claim 1 wherein the photovoltaic cell material containing a Group VI element comprises cadmium telluride, cadmium selenide, cadmium sulfide, zinc telluride, zinc selenide, zinc sulfide, antimony telluride, antimony selenide, antimony sulfide, mercury telluride, mercury selenide, mercury sulfide, copper indium selenide, copper indium sulfide, copper gallium selenide, or one or more combinations thereof.

3. The method of claim 1 wherein the exposing step comprises utilizing plasma treatment, a hot plate, a temperature-controlled chuck, a rapid thermal anneal, a photon treatment, an ion implantation, or one or more combinations thereof.

4. The method of claim 1 wherein the removing step forms one or more Group VI fluorides.

5. The method of claim 4 wherein the one or more Group VI fluorides comprises tellurium fluoride, sulfur fluoride, selenium fluoride, or one or more combinations thereof.

6. The method of claim 5 wherein removing step further comprises applying a temperature and pressure to the photovoltaic cell material at which the tellurium fluoride, the sulfur fluoride, the selenium fluoride, or one or more combinations thereof are substantially volatile.

7. The method of claim 1 wherein the forming step further comprises forming a nanoscale layer substantially comprising one or more non-Group VI fluorides.

8. The method of claim 7 wherein the one or more non-Group VI fluorides comprises cadmium fluoride, zinc fluoride, antimony fluoride, mercury fluoride, copper fluoride, indium fluoride, gallium fluoride, tin fluoride, or one or more combinations thereof.

9. A method of making a nanoscale layer between a p-type layer of a photovoltaic cell material containing a Group VI element and an electrical contact, comprising the steps of:
    providing the p-type layer;
    creating at least a portion of a nanoscale layer atop the p-type layer by exposing at least a portion of a surface of said p-type layer to a gas comprising a fluorine, wherein the at least a portion of the nanoscale layer has a thickness of about 0.5 to about 25 nanometers and wherein the portion of the nanoscale layer allows electrical current flow between the p-type layer and the electrical contact, the electrical current flow allowed by the nanoscale layer comprising tunneling; and
    forming an electrical contact comprising a metal in electrical communication with the nanoscale layer; wherein the at least a portion of the nanoscale layer comprises fluorine and starts at an interface with the surface of said p-type layer and ends at an interface with the electrical contact.

10. The method of claim 9, further comprising creating the portion of the nanoscale layer to provide an atomic and/or molecular diffusion impedance barrier layer that substantially impedes atomic and/or molecular diffusion between the portion of the p-type layer and the electrical contact.

11. The method of claim 10, further comprising creating the portion of the nanoscale layer to impede the diffusion of a metal from the metal electrical contact.

12. The method of claim 9, wherein the creating step further comprises utilizing plasma treatment, a hot plate, a temperature-controlled chuck, rapid thermal annealing, photon treatment, ion implantation, or one or more combinations thereof.

13. The method of claim 9, wherein the p-type layer comprises a compound of sulfur, selenium, tellurium, or one or more combinations thereof.

14. The method of claim 9, wherein the photovoltaic cell material containing a Group VI element further comprises cadmium, zinc, antimony, mercury, or one or more combinations thereof.

15. The method of claim 9, wherein the portion of the nanoscale layer comprises cadmium fluoride, zinc fluoride, antimony fluoride, mercury fluoride, or one or more combinations thereof.

16. The method of claim 9, wherein the photovoltaic cell material containing a Group VI element further comprises copper, indium, gallium, tin, or one or more combinations thereof.

17. The method of claim 9, wherein the portion of the nanoscale layer comprises copper fluoride, indium fluoride, gallium fluoride, tin fluoride, or one or more combinations thereof.

18. The method of claim 9, wherein at least a portion of the electrical contact in contact with the photovoltaic cell material containing a Group VI element further comprises one or more precious metals, copper, aluminum, zinc, tin, lead, indium, gallium, selenium, antimony, chrome, nickel, cobalt, cesium, magnesium, mercury, zinc telluride, mercury telluride, antimony telluride, tin oxide, indium tin oxide, cadmium stannate, graphite, or one or more combinations thereof.

19. The method of claim 18, wherein the one or more precious metals comprises one or both of the elements gold and silver.

20. A method of making a nanoscale layer between an n-type layer and a p-type layer of a photovoltaic cell material containing a Group VI element, comprising the steps of:
    providing an n-type layer comprising a Group VI element;
    creating at least a portion of a nanoscale layer atop at least a portion of the n-type layer by exposing at least a portion of a surface of said n-type layer to a fluorine containing gas;
    forming at least a portion of a p-type layer atop the portion of the nanoscale layer; wherein the at least a portion of the nanoscale layer has a thickness of about 0.5 to about 25 nanometers, comprises fluorine, and starts at an interface with the surface of said n-type layer and ends at an interface with said p-type layer; and wherein the creating step comprises creating at least a portion of a nanoscale layer allowing electrical current flow between at least a portion of the n-type layer and the portion of the p-type layer of the photovoltaic cell, wherein the electrical current flow allowed by the nanoscale layer comprises tunneling.

21. The method of claim 20, further comprising creating the portion of the nanoscale layer to provide an atomic and/or molecular diffusion impedance barrier layer that substantially impedes atomic and/or molecular diffusion between the portion of the n-type layer and the portion of the p-type layer.

22. The method of claim 20, further comprising:
forming an electrical contact comprising a metal atop the portion of the p-type layer; and
creating the portion of the nanoscale layer to provide an atomic and/or molecular diffusion impedance barrier layer that substantially impedes atomic and/or molecular diffusion between the electrical contact and the n-type layer.

23. The method of claim 20, wherein the portion of the nanoscale layer has a thickness of about 0.5 to about 25 nanometers.

24. The method of claim 20, wherein the creating step further comprises utilizing plasma treatment, a hot plate, a temperature-controlled chuck, rapid thermal annealing, photon treatment, ion implantation, or one or more combinations thereof.

25. The method of claim 20, wherein the n-type layer comprises a compound further comprising sulfur, selenium, tellurium or one or more combinations thereof.

26. The method of claim 25, wherein the n-type layer comprises cadmium sulfide, cadmium selenide, cadmium telluride, zinc sulfide, zinc selenide, zinc telluride, or one or more combinations thereof.

27. The method of claim 26, wherein the portion of the nanoscale layer formed atop the n-type layer comprises cadmium fluoride, zinc fluoride, or one or more combinations thereof.

28. A method of impeding diffusion in a photovoltaic cell of a p-type dopant from within a p-type layer of material into an n-type layer of material containing a Group VI element, comprising the steps of:
providing an n-type layer comprising a Group VI element;
creating at least a portion of a nanoscale layer atop the n-type layer by exposing at least a portion of a surface of the n-type layer to a fluorine containing gas, wherein the at least a portion of the nanoscale layer provides an atomic and/or molecular diffusion impedance layer that substantially impedes atomic and/or molecular diffusion of the p-type dopant from a portion of the p-type layer to the n-type layer;
forming at least the portion of the p-type layer atop the portion of the nanoscale layer; wherein the at least a portion of the nanoscale layer has a thickness of about 0.5 to about 25 nanometers, comprises fluorine, and starts at an interface with the at least a portion of the surface of the n-type layer and ends at an interface with the portion of the p-type layer;
applying a p-type dopant atop the portion of the p-type layer; and
wherein the creating step comprises creating at least a portion of a nanoscale layer allowing electrical current flow between at least a portion of the n-type layer and the portion of the p-type layer of the photovoltaic cell, wherein the electrical current flow allowed by the nanoscale layer comprises tunneling.

29. The method of claim 28, wherein the p-type dopant comprises a compound further comprising copper, gold, arsenic, antimony, phosphorus, nitrogen, or one or more combinations thereof.

30. The method of claim 28, further comprising diffusing at least a portion of the p-type dopant into the portion of the p-type layer.

31. The method of claim 28 further comprising creating the portion of the nanoscale layer to provide an atomic and/or molecular diffusion impedance barrier layer that substantially impedes atomic and/or molecular diffusion of the p-type dopant from the portion of the p-type layer to the n-type layer.

32. The method of claim 28, wherein the portion of the nanoscale layer has a thickness of about 0.5 to about 25 nanometers.

33. The method of claim 28, wherein the creating step further comprises utilizing plasma treatment, a hot plate, a temperature-controlled chuck, rapid thermal annealing, photon treatment, ion implantation, or one or more combinations thereof.

34. The method of claim 28, wherein the portion of the n-type layer comprises a compound further comprising sulfur, selenium, tellurium, or one or more combinations thereof.

35. The method of claim 34, wherein said n-type layer comprises cadmium sulfide, cadmium selenide, cadmium telluride, zinc sulfide, zinc selenide, zinc telluride, or one or more combinations thereof.

36. The method of claim 35, wherein the portion of the nanoscale layer formed atop the n-type layer comprises cadmium fluoride, zinc fluoride, or one or more combinations thereof.

* * * * *